United States Patent
Sandford et al.

(10) Patent No.: US 7,768,079 B2
(45) Date of Patent: Aug. 3, 2010

(54) TRANSISTORS WITH HIGH-K DIELECTRIC SPACER LINER TO MITIGATE LATERAL OXIDE ENCROACHEMENT

(75) Inventors: Justin S. Sandford, Tigard, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 11/862,017

(22) Filed: Sep. 26, 2007

(65) Prior Publication Data

US 2009/0079014 A1    Mar. 26, 2009

(51) Int. Cl.
*H01L 29/76* (2006.01)
(52) U.S. Cl. ............... 257/410; 257/411; 257/900
(58) Field of Classification Search ............ 257/410, 257/411, 900
See application file for complete search history.

(56) References Cited

U.S. PATENT DOCUMENTS

| | | | | |
|---|---|---|---|---|
| 6,858,907 | B2* | 2/2005 | Ryu et al. | 257/412 |
| 7,226,831 | B1* | 6/2007 | Metz et al. | 438/216 |
| 7,405,116 | B2* | 7/2008 | Carter et al. | 438/183 |
| 7,492,006 | B2* | 2/2009 | Buh et al. | 257/344 |
| 2007/0262399 | A1* | 11/2007 | Dewey et al. | 257/410 |

OTHER PUBLICATIONS

United States Patent Application, pending—not yet issued, U.S. Appl. No. 11/848,239, filed Aug. 30, 2007, to Rachmady et al.
United States Patent Application, pending—not yet issued, U.S. Appl. No. 11/765,023, filed Jun. 19, 2007, to Rachmady et al.
United States Patent Application, pending—not yet issued, U.S. Appl. No. 11/648,512, filed Dec. 29, 2006, to Singh et al.
United States Patent Application, pending—not yet issued, U.S. Appl. No. 11/521,624, filed Sep. 15, 2006, to Kavalieros et al.
United States Patent Application, pending—not yet issued, U.S. Appl. No. 11/479,713, filed Jun. 30, 2006, to Shah et al.
United States Patent Application, pending—not yet issued, U.S. Appl. No. 11/387,012, filed Mar. 21, 2006, to Rachmady et al.
United States Patent Application, pending—not yet issued, U.S. Appl. No. 11/382,515, filed May 10, 2006, to Dewey et al.

* cited by examiner

*Primary Examiner*—Mark Prenty
(74) *Attorney, Agent, or Firm*—David L. Guglielmi

(57) ABSTRACT

Embodiments of the invention generally relate to transistors with high-k dielectric spacer liner to mitigate lateral oxide encroachment. In this regard a semiconductor device is introduced having a substrate, a high-k gate dielectric layer on the substrate, a metal gate electrode on the high-k gate dielectric layer, and a high-k dielectric layer on either side of and adjacent to the metal gate electrode and high-k gate dielectric layer, extending a distance away from the metal gate electrode and high-k gate dielectric layer on the substrate. Other embodiments are also disclosed and claimed.

5 Claims, 4 Drawing Sheets

TRANSISTORS WITH HIGH-K DIELECTRIC SPACER LINER TO MITIGATE LATERAL OXIDE ENCROACHEMENT

BACKGROUND

Background of the Invention

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. When conventional processes are used to form such transistors, a silicon dioxide transition layer with birds beak formation may form between the high-k dielectric and the substrate, between the spacer and gate stack and between the spacer and substrate. The presence of that transition layer may unfavorably contribute to the overall electrical thickness of the gate dielectric stack.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
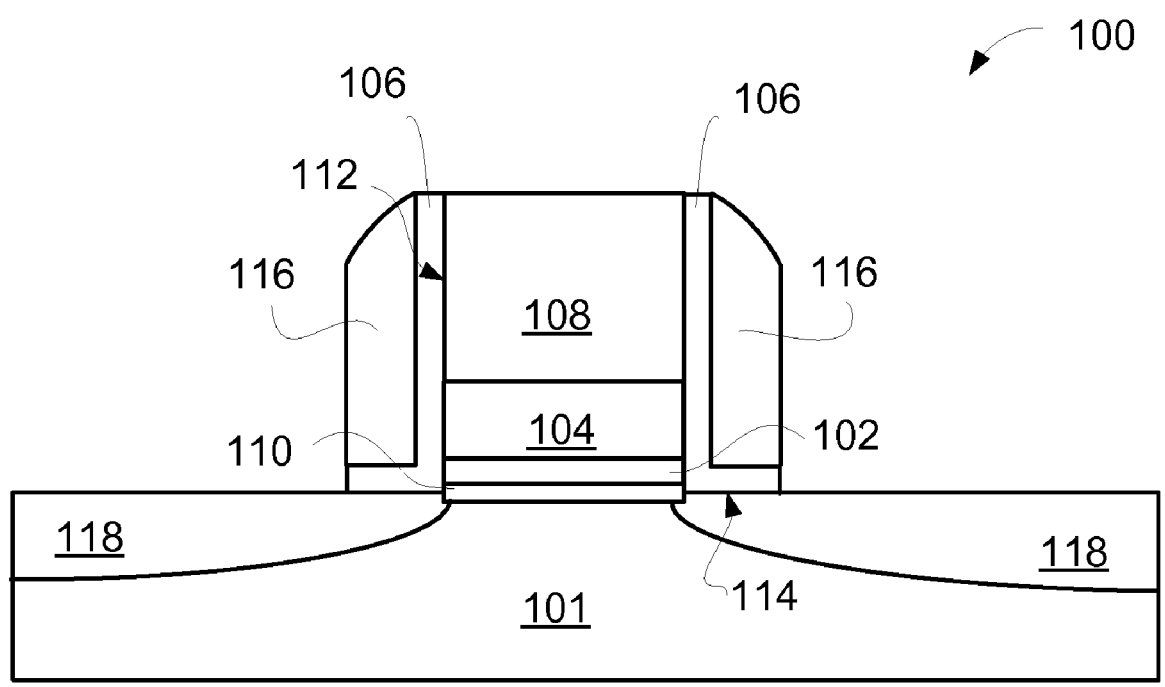
FIG. 1 is a cross sectional side view that illustrates the semiconductor device of one embodiment of the present invention.

FIG. 1 is a cross sectional side view that illustrates the semiconductor device 100 of one embodiment of the present invention. That semiconductor device may have a gate electrode stack, which may include a high-k gate dielectric layer 102 on substrate 101, a first electrode layer 104 on the high-k gate dielectric layer 102, and a second electrode layer 108 on the first electrode layer 104. In an embodiment, the second electrode layer 108 may comprise polysilicon. In an embodiment, the first electrode layer 104 may comprise a capping material to separate the polysilicon from the high-k gate dielectric layer 102 material. In another embodiment, the first electrode layer 104 may comprise a metal material having a desired work function for the device 100 once it is completed. In other embodiments, there may be more than two electrode layers, while in yet other embodiments, there may only be one electrode layer on the high-k gate dielectric layer 102. There may be a thin oxide or oxynitride transitional layer 110 on the substrate 101 between the gate stack 102, 104, 108 and the substrate 101 in some embodiments. This thin oxide transition layer 110 may be as thin as a monolayer of oxide in some embodiments. In another embodiment, the thin oxide layer 110 may have two layers of oxide, while in other embodiments the oxide transition layer 110 may be thicker. In some embodiments, the oxide transition layer 110 may have a thickness between about 3 angstroms and about 6 angstroms, although another embodiment may have an oxide transition layer 110 with a different thickness.

The substrate 101 may comprise any material that may serve as a foundation upon which a semiconductor device may be built. In this embodiment, substrate 101 is a silicon containing substrate. The substrate 101 may be a bulk substrate 101, such as a wafer of single crystal silicon, a silicon-on-insulator (SOI) substrate 101, such as a layer of silicon on a layer of insulating material on another layer of silicon, or another type of substrate 101. The device 100 formed on the substrate 101 may be a transistor in some embodiments. The device 100 may be a planar transistor on a bulk substrate 101, a planar transistor on an SOI substrate 101, a FIN-FET transistor on a bulk substrate 101, a FIN-FET transistor on an SOI substrate 101, a tri-gate transistor on a bulk substrate 101, a tri-gate transistor on an SOI substrate, or another type of transistor or other device 100.

The high-k gate dielectric layer 102 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Although a few examples of materials that may be used to form the high-k gate dielectric layer 102 are described here, the high-k gate dielectric layer 102 may be made from other materials that serve to reduce gate leakage in other embodiments.

In some embodiments, the high-k gate dielectric layer 102 may be less than about 40 angstroms thick. In other embodiments, the high-k gate dielectric layer 102 may be between about 5 angstroms and about 20 angstroms thick.

The high-k gate dielectric layer 102 may have a k-value higher than about 7.5 in some embodiments. In other embodiments, the high-k gate dielectric layer 102 may have a k-value higher than about 10. In other embodiments, the high-k gate dielectric layer 102 may comprise a material such as $Al_2O_3$ with a k-value of about 12, or may comprise a material with a higher k-value than that. In other embodiments, the high-k gate dielectric layer 102 may have a k-value between about 15 and about 25, e.g. $HfO_2$. In yet other embodiments, the high-k gate dielectric layer 102 may have a k-value even higher, such as 35, 80 or even higher.

The first electrode layer 104 may comprise a metal gate electrode layer 104 in some embodiments. This metal gate electrode layer 104 may comprise any conductive material from which metal gate electrodes may be derived. Materials that may be used to form n-type metal gate electrodes include: hafnium, zirconium, titanium, tantalum, aluminum, their alloys (e.g., metal carbides that include these elements, i.e., hafnium carbide, zirconium carbide, titanium carbide, tantalum carbide, and aluminum carbide), and aluminides (e.g., an aluminide that comprises hafnium, zirconium, titanium, tantalum, or tungsten). Materials for forming p-type metal gate electrodes include: ruthenium, palladium, platinum, cobalt, nickel, and conductive metal oxides, e.g., ruthenium oxide. Alternatively, a mid-gap metal gate material, e.g. stoichiometric titanium nitride or tantalum nitride, may be used in some embodiments, such as embodiments in which the substrate 101 is a SOI substrate 101.

In some embodiments, metal NMOS gate electrodes may have a workfunction that is between about 3.9 eV and about 4.2 eV. In some embodiments, metal PMOS gate electrodes may have a workfunction that is between about 4.9 eV and about 5.2 eV. In some embodiments, metal mid-gap gate electrodes may have a workfunction between those of NMOS and PMOS metal gate electrodes. A metal gate electrode 104 that is formed on a high-k gate dielectric layer 102 may consist essentially of a homogeneous metal layer. Alternatively, relatively thin n-type or p-type metal layers (like those listed above) may generate the lower part of the metal gate electrode, with the remainder of the metal gate electrode comprising another metal or metals, e.g., a metal that may be easily polished like tungsten, aluminum, titanium, or titanium nitride. Although a few examples of materials for forming a metal gate electrode are identified here, such a component may be made from many other materials, as will be apparent to those skilled in the art.

As mentioned above, the second gate electrode layer 108 may comprise polysilicon. This polysilicon electrode layer 108 may comprise a doped polysilicon material in some embodiments, with dopants chosen to be appropriate to the device 100 type. In other embodiments, the second gate electrode layer 108 may comprise other materials. In yet other embodiments, the gate stack may only include one gate electrode layer 104 on the high-k gate dielectric layer 102, in which case the second gate electrode layer 108 would be absent.

High-k dielectric layer 106 may be disposed on the sides of and adjacent to the gate stack and extending a distance along the top of substrate 101. High-k dielectric layer 106 may comprise a metal oxide. For example, high-k dielectric layer 106 may include hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, or lead scandium tantalum oxide. In one embodiment, high-k dielectric layer 106 is the same material as high-k gate dielectric 102. In another embodiment, high-k dielectric layer 106 is a different material than high-k gate dielectric 102. High-k dielectric layer 106 may comprise a substantially uniform thickness in a range of from about 10 angstroms to about 30 angstroms. High-k dielectric layer 106 may have a same thickness as or a different thickness than high-k gate dielectric 102.

There may be spacers 116 on high-k dielectric layer 106 on either side of the gate stack. In one embodiment the spacers 116 may comprise a nitride material. In other embodiments, the spacers 116 may comprise other materials.

Doped regions 118 may be tip junctions of semiconductor device 100 formed by ion implantation or other methods known in the art. In one embodiment, one doped region 118 will form a source while the other doped region 118 will form a drain for semiconductor device 100. Doped regions 118 may be partially covered by high-k dielectric layer 106. However, during further processing, high-k dielectric layer 106 should not be present above the source, the drain, and the top of the gate stack.

There may be a boundary region 112 between high-k dielectric layer 106 and the gate stack (between high-k dielectric layer 106 and the second electrode layer 108, the first electrode layer 104, and the high-k gate dielectric layer 102) that may be substantially entirely free of an oxide layer in an embodiment. There may be a boundary region 114 between high-k dielectric layer 106 and the substrate 101 that may also be substantially entirely free of an oxide layer in an embodiment. In some embodiments, the high-k dielectric layer 106 may be in direct contact with one or more layers of the gate stack (the high-k gate dielectric layer 102, the first electrode layer 104, and the second electrode layer 108) and/or may be in direct contact with the substrate 101. High-k dielectric layer 106 may hermetically seal oxide transition layer 110 at the junction between the gate stack and substrate 101. There may be substantially no birds beak structure at the left and right edges (as illustrated in FIG. 1) of the gate stack in the region between the high-k gate dielectric layer 102 and the substrate 101. There may be substantially no birds beak structure at the left and right edges (as illustrated in FIG. 1) of the gate stack in the region between the high-k gate dielectric layer 102 and the first electrode layer 104. The lack of oxide materials between the spacers and gate stack and/or substrate, and/or lack of birds beak structures may provide a device 100 with better performance than devices 100 that have such structures. Such structures may provide, or be indicative of, transport of oxygen, which may result in a thicker transitional oxide layer 110, which may reduce device 100 performance.

Figure 2:
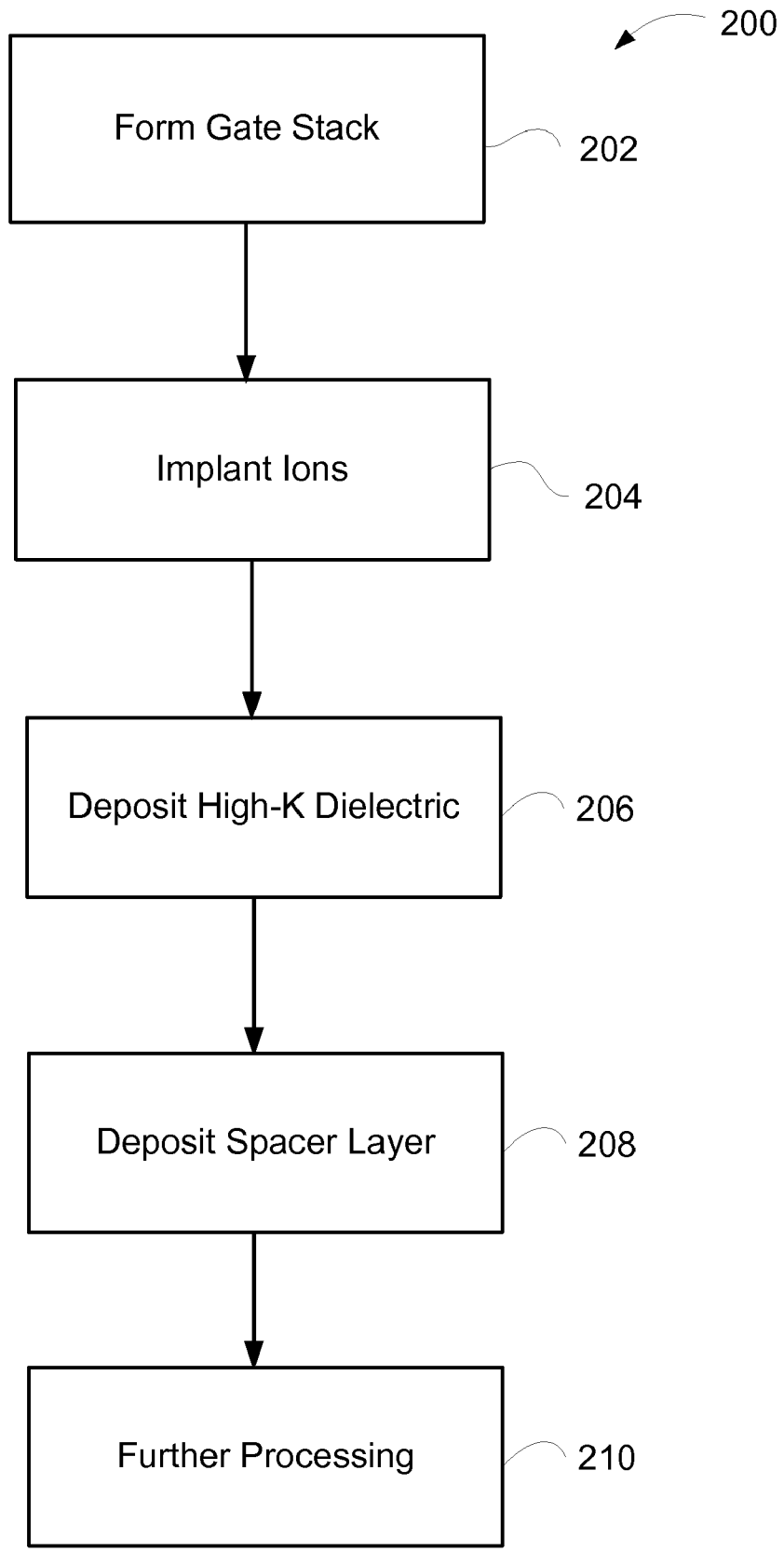
FIG. 2 is a flow chart that illustrates how the device of FIG. 1 may be formed, according to one embodiment of the present invention.

FIG. 2 is a flow chart 200 that illustrates how the device 100 of FIG. 1 may be formed, according to one embodiment of the present invention. The gate stack, including the high-k gate dielectric layer 102, first electrode layer 104, and second electrode layer 108 may be formed 202. Ions may be implanted 204 to form tip junction regions (doped regions 118) in the substrate 101. High-k dielectric layer 106 may then be deposited 206. The spacers 116 may then be deposited 208, followed by further processing 210. The further processing 210 may include annealing to recrystallize regions of the substrate 101 that were amorphized by the implantation 204 process, forming interlayer dielectric (ILD) layer(s) and interconnects, and/or other processes.

Figure 3:
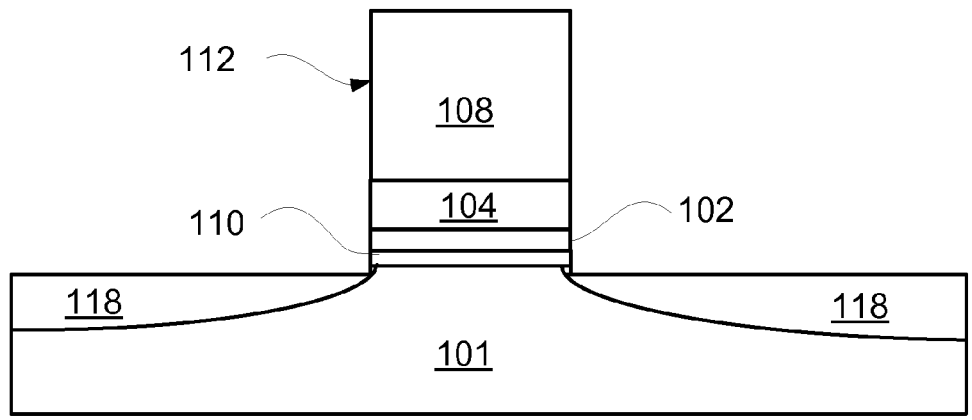
FIG. 3 is a cross sectional side view that illustrates an embodiment after gate formation and ion implantation.
Figure 4:
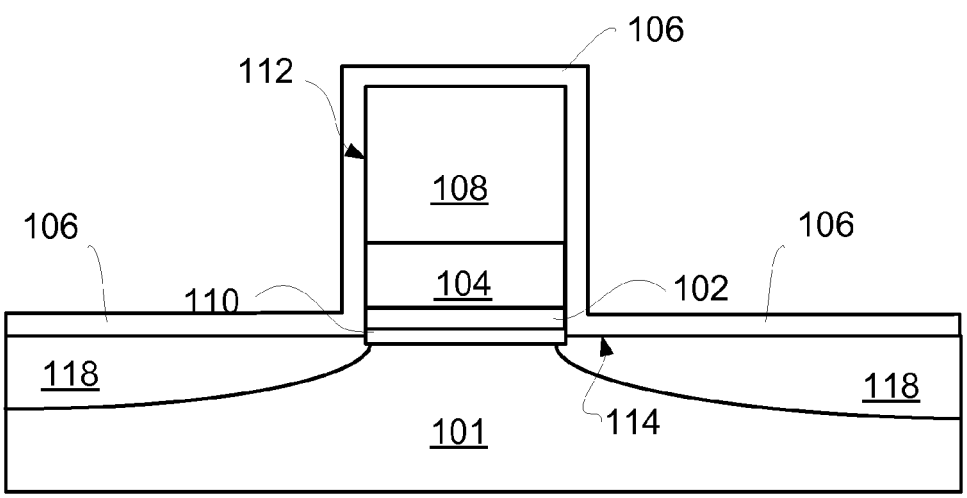
FIG. 4 is a cross sectional side view that illustrates deposition of a blanket high-k dielectric layer, according to an embodiment.
Figure 5:
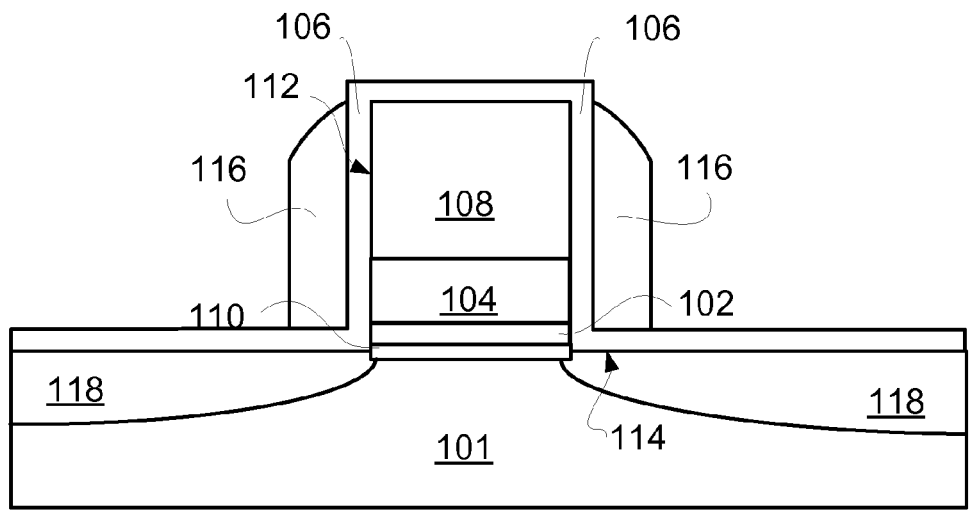
FIG. 5 is a cross sectional side view that illustrates the formation of a spacer layer, according to an embodiment.

FIGS. 3 through 5 are cross sectional side views that illustrate the formation of the device 100 as described above with respect to FIG. 2, as well as some additional processing that may be performed in some embodiments.

FIG. 3 is a cross sectional side view that illustrates an embodiment after gate formation and ion implantation. In an embodiment, the high-k gate dielectric layer 102 may be formed on the substrate 101 by an atomic layer chemical vapor deposition ("ALCVD") process, although in other embodiments other processes may be used. In an ALCVD process, a growth cycle may be repeated until a high-k gate dielectric layer 102 of a desired thickness is created. Such a growth cycle may comprise the following sequence in an embodiment. Steam is introduced into a CVD reactor for a selected pulse time, followed by a purging gas. A precursor (e.g., an organometallic compound, a metal chloride or other metal halide) is then pulsed into the reactor, followed by a second purge pulse. (A carrier gas that comprises nitrogen or another inert gas may be injected into the reactor at the same time.)

While operating the reactor at a selected pressure and maintaining the substrate at a selected temperature, steam, the purging gas, and the precursor are, in turn, fed at selected flow rates into the reactor. By repeating this growth cycle—steam, purging gas, precursor, and purging gas—multiple times, one may create a blanket high-k gate dielectric layer 102 of a desired thickness on the substrate 101. The pressure at which the reactor is operated, the gases' flow rates, and the temperature at which the substrate is maintained may be varied depending upon the application and the precursor that is used. The CVD reactor may be operated long enough to form the blanket high-k gate dielectric layer 102 with the desired thickness. In some embodiments, the blanket high-k gate dielectric layer 102 may be less than about 40 angstroms thick. In other embodiments, the blanket high-k gate dielectric layer 102 may be between about 5 angstroms and about 20 angstroms thick.

After forming the blanket high-k gate dielectric layer 102 on the substrate 101, the blanket first electrode layer 104 may be formed on the blanket high-k gate dielectric layer 102. Any suitable method may be used. In an embodiment where the blanket first electrode layer 104 is a blanket metal gate electrode layer 104, the blanket metal gate electrode layer 104 may be formed using conventional metal deposition processes, e.g. CVD or PVD processes, by using ALCVD, or another suitable method. Materials besides metal may be used for the first electrode layer 104. For example, in an embodiment where the first electrode layer 104 will be removed and replaced later by a metal gate electrode layer and the second electrode layer 108 comprises polysilicon, any suitable material that keeps the high-k gate dielectric layer 102 from undesirably interacting with the second electrode layer 108 may be used.

After forming the blanket first electrode layer 104 on the high-k gate dielectric layer 102, the blanket second electrode layer 108 may be formed on the blanket first electrode layer 104. Any suitable method may be used to form the blanket second electrode layer 108. In an embodiment, the blanket second electrode layer 108 may comprise polysilicon, although other materials may be used in other embodiments. Some embodiments may lack the blanket second electrode layer 108 and include only the first blanket electrode layer 104. Still other embodiments may include additional blanket electrode layers (not shown) on the blanket second electrode layer 108. Any suitable method may be used to pattern the layers 102, 104, 108. Combined, the high-k gate dielectric layer 102, first electrode layer 104, and the second electrode layer 108 may be considered a gate stack, with a sidewall boundary 112. Ions (not shown) may be implanted into the substrate 101 to form doped regions 118. These doped regions 118 may be tip junctions of a device after the device is completed. In some cases the choice of implantation ions and/or the amorphization of the surface layer may enhance the oxidation rate or the rate of oxidation diffusion through such a layer.

FIG. 4 is a cross sectional side view that illustrates deposition of a blanket high-k dielectric layer, according to an embodiment. In an embodiment, between about 10 and about 30 angstroms of the high-k dielectric 106 may be deposited on the exposed surfaces of the gate stack 102, 104, 108 and substrate 101, according to an embodiment. Atomic layer deposition may be performed for between about 25 and about 50 cycles, where about one half angstrom of high-k dielectric 106 is deposited per cycle. Vertical boundary regions 112 and horizontal boundary regions 114 may be covered with a substantially uniform thickness of high-k dielectric 106.

FIG. 5 is a cross sectional side view that illustrates the formation of a spacer layer, according to an embodiment. In an embodiment, the spacer layer 116 may comprise a nitride material such as a carbon doped nitride, a stoichiometric silicon nitride, or another material. The spacer layer 116 may be deposited by chemical or physical vapor deposition, atomic layer deposition, plasma enhanced chemical vapor deposition, or other methods.

The high-k dielectric layer 106 may at least partially, if not completely, prevent oxygen from reaching regions beneath the high-k dielectric layer 106 during such high temperature processes as annealing or other additional processes. The high-k dielectric layer 106 may hermetically seal the thin oxide layer 110 from oxygen-containing structures and/or ambient oxygen in further process steps. This prevention of oxygen transport beneath the gate stack 102, 104, 108 may at least partially prevent oxidation of the substrate 101, which could result in the formation of additional undesired oxide 110, such as silicon oxide, beneath the gate stack 102, 104, 108 and/or formation of lateral oxide structures such as birds beak structures. Such an undesired oxide could degrade the performance of the device if its formation is not prevented. The exposed high-k dielectric layer 106, for example on top of electrode 108 and the portion on top of substrate 101 not under spacer 116, may be removed by selective wet etch, phosphoric acid for example, or a combination of implant and wet etch, resulting in the device illustrated in FIG. 1. Standard processing sequences may then be followed to complete remaining parts of the device.

Figure 6:
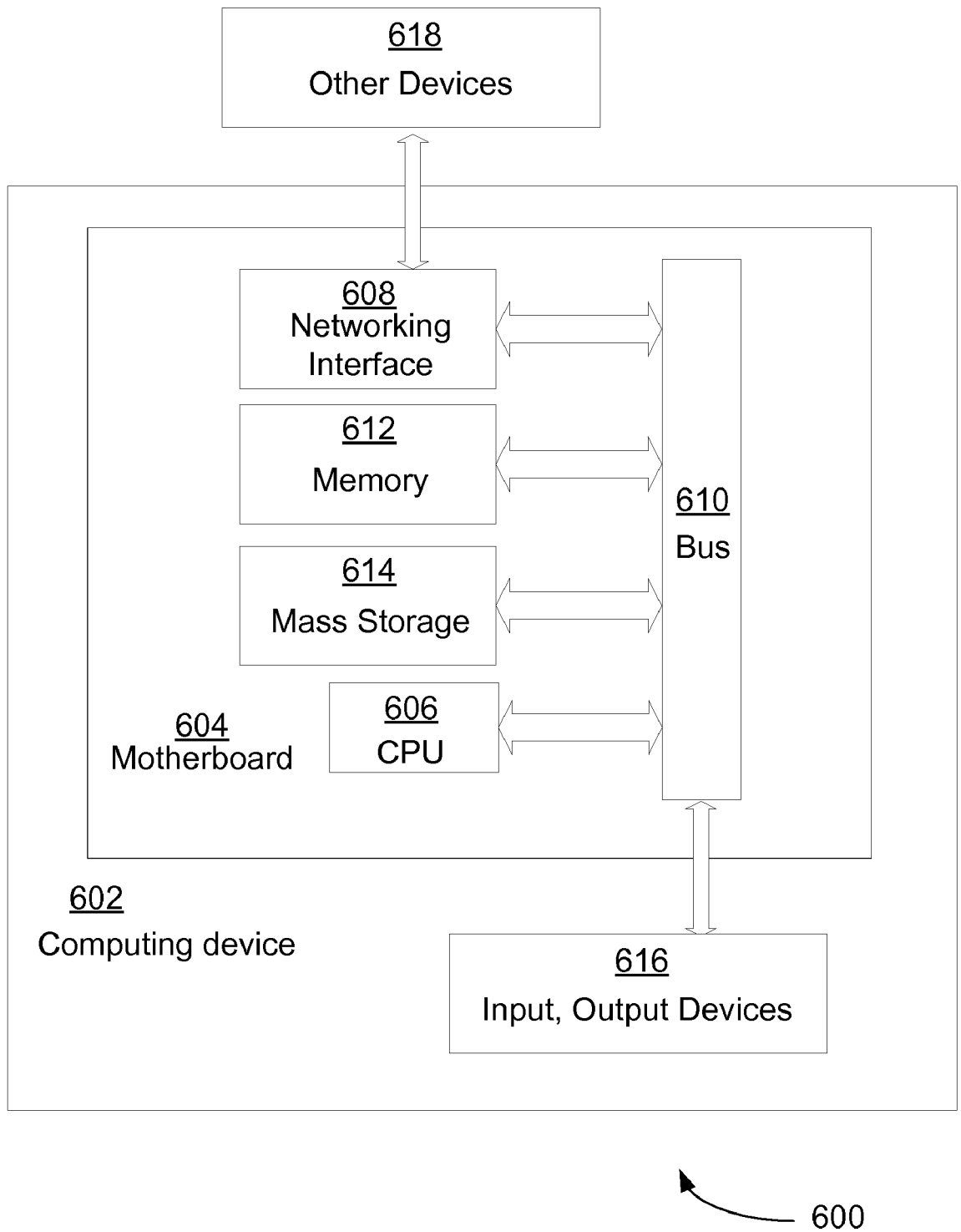
FIG. 6 illustrates a system in accordance with one embodiment of the present invention.

FIG. 6 illustrates a system 600 in accordance with one embodiment of the present invention. One or more devices formed with the high-k dielectric layer 106 that seals the under-gate-stack region from oxygen to prevent oxide layer 110 growth as described above may be included in the system 600 of FIG. 6. As illustrated, for the embodiment, system 600 includes a computing device 602 for processing data. Computing device 602 may include a motherboard 604. Coupled to or part of the motherboard 604 may be in particular a processor 606, and a networking interface 608 coupled to a bus 610. A chipset may form part or all of the bus 610. The processor 606, chipset, and/or other parts of the system 600 may include one or more devices 100 described above.

Depending on the applications, system 600 may include other components, including but are not limited to volatile and non-volatile memory 612, a graphics processor (integrated with the motherboard 604 or connected to the motherboard as a separate removable component such as an AGP or PCI-E graphics processor), a digital signal processor, a crypto processor, mass storage 614 (such as hard disk, compact disk (CD), digital versatile disk (DVD) and so forth), input and/or output devices 616, and so forth.

In various embodiments, system 600 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 606, 614, etc. in FIG. 6 may include one or more devices with the high-k dielectric layer 106 as described herein. For example, a transistor device 100 may be part of the CPU 606, motherboard 604, graphics processor, digital signal processor, or other devices.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A transistor, comprising:
   a high-k gate dielectric layer on a semiconductor substrate;
   a transition layer of silicon dioxide between the high-k gate dielectric layer and the substrate;
   a gate electrode layer on the high-k gate dielectric layer, wherein the high-k gate dielectric layer and the gate electrode layer are patterned to form a gate stack having a top, a first side, and a second side; and
   a high-k metal oxide dielectric layer on a top surface of the substrate and the first and second sides of the patterned gate stack, the high-k metal oxide dielectric layer on a source and a drain formed in the top surface of the substrate, the high-k metal oxide dielectric layer having a thickness in the range of about 10 to 30 angstroms.

2. The transistor of claim 1, further comprising the high-k metal oxide dielectric layer on the top of the patterned gate stack.

3. The transistor of claim 1, wherein the high-k metal oxide dielectric layer forms a hermetic seal of the transition layer.

4. The transistor of claim 1, wherein the high-k metal oxide dielectric layer comprises a material chosen from the group consisting of: hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, and lead scandium tantalum oxide.

5. The transistor of claim 1, further comprising a spacer layer on the high-k metal oxide dielectric layer.

* * * * *